United States Patent
Audemar

(10) Patent No.: US 10,414,412 B2
(45) Date of Patent: Sep. 17, 2019

(54) TRACTION BOX OF A RAILWAY VEHICLE WITH A COOLING SYSTEM, ASSOCIATED APPLICATION METHOD AND RAILWAY VEHICLE

(71) Applicant: ALSTOM TRANSPORT TECHNOLOGIES, Saint-Ouen (FR)

(72) Inventor: Christophe Audemar, Horgues (FR)

(73) Assignee: ALSTOM TRANSPORT TECHNOLOGIES, Saint-Ouen (FR)

( * ) Notice: Subject to any disclaimer, the term of this patent is extended or adjusted under 35 U.S.C. 154(b) by 365 days.

(21) Appl. No.: 15/455,494

(22) Filed: Mar. 10, 2017

(65) Prior Publication Data
US 2017/0259834 A1 Sep. 14, 2017

(30) Foreign Application Priority Data
Mar. 11, 2016 (FR) .................... 16 52083

(51) Int. Cl.
*B61C 3/00* (2006.01)
*B61C 17/00* (2006.01)
*H05K 7/20* (2006.01)

(52) U.S. Cl.
CPC ............ *B61C 17/00* (2013.01); *B61C 3/00* (2013.01); *H05K 7/20909* (2013.01); *H05K 7/20927* (2013.01)

(58) Field of Classification Search
CPC ...... B61C 17/00; B61C 3/00; H05K 7/20909; H05K 7/20927; H05K 7/202; H05K 7/20154; H05K 7/20609; H05K 7/20; H05K 7/20263; B60L 1/02; B61D 27/00
See application file for complete search history.

(56) References Cited

U.S. PATENT DOCUMENTS

| | | | | |
|---|---|---|---|---|
| 5,323,847 A | * | 6/1994 | Koizumi | H05K 7/20645 165/104.32 |
| 7,855,890 B2 | * | 12/2010 | Kashirajima | F25B 25/00 361/679.46 |
| 9,309,982 B2 | * | 4/2016 | Akiyama | B60R 16/00 |
| 10,254,021 B2 | * | 4/2019 | McDonnell | F25B 29/003 |
| 2007/0044493 A1 | * | 3/2007 | Keamey | F25B 5/02 62/259.2 |

(Continued)

FOREIGN PATENT DOCUMENTS

EP 2 506 695 A2 12/2012

OTHER PUBLICATIONS

FR Search Report, dated Nov. 8, 2016, from corresponding FR application.

*Primary Examiner* — Mark T Le
(74) *Attorney, Agent, or Firm* — Young & Thompson

(57) ABSTRACT

A traction box of a railway vehicle includes pieces of electric equipment; and a cooling device including a first and second fluid circuits, respectively crossing first and second heat exchange areas with the pieces of electric equipment; and first and second of heat exchangers, respectively crossed by the first and the second fluid circuits and allowing heat exchange between the fluid and a first air flow. The fluid circuits include a first common conduit for fluid circulation, crossing the first exchanger, and then connected to the second and to a third parallel conduits, the second conduit belonging to the second fluid circuit and first crossing the second exchanger and then the second heat exchange area.

12 Claims, 2 Drawing Sheets

(56) References Cited

U.S. PATENT DOCUMENTS

| | | | |
|---|---|---|---|
| 2007/0051490 A1 | 3/2007 | Walter | |
| 2012/0111027 A1* | 5/2012 | Campbell | F25B 21/02 62/3.3 |
| 2014/0211531 A1* | 7/2014 | Yamashita | H02M 7/003 363/141 |

* cited by examiner

TRACTION BOX OF A RAILWAY VEHICLE WITH A COOLING SYSTEM, ASSOCIATED APPLICATION METHOD AND RAILWAY VEHICLE

FIELD OF THE INVENTION

The present invention relates to a traction box of a railway vehicle, comprising first and second pieces of electric equipment, and a cooling device able to remove heat dissipated by said first and second pieces of electric equipment, the cooling device comprising: a first and a second fluid circuits, respectively crossing a heat exchange area with the first and with the second pieces of electric equipment, each of the first and second fluid circuits forming a closed loop; and a first and a second heat exchangers, respectively crossed by said first and said second fluid circuits and allowing a heat exchange between said fluid and a first air flow.

BACKGROUND OF THE INVENTION

The invention is applied to the field of railway transport, notably to electric traction vehicles, such as locomotives and self-propelled machines.

By <<traction box>>, is meant in the sense of the present invention the portion of a traction vehicle which is intended to control the traction motors of said vehicle.

DESCRIPTION OF THE RELATED APPLICATION

The cooling device is typically intended to cool a portion of the pieces of electric equipment such as a power module or a transformer, in order to avoid overheating of said pieces of electric equipment.

For high power traction boxes, it is difficult to sufficiently cool the room temperature of pieces of electrical equipment by means of coolers such as heat exchangers of the air/air type. Indeed, in addition to the significant heat dissipated by said pieces of equipment, the traction boxes are generally installed in a technical service room, the room temperature of which is increased by the presence of other electrical apparatuses.

Notably from document US2007/0051490 the cooling of pieces of electric equipment by means of cooling fluid circuits is notably known, said cooling fluid being itself cooled by an outdoor air flow.

In particular, document US2007/0051490 apprises two distinct circuits of cooling fluid, in order to promote the cooling of certain pieces of electrical equipment with respect to other ones.

SUMMARY OF THE INVENTION

The present invention has the object of proposing a traction box simple to make, while allowing regulation in a priority way, of the cooling of certain pieces of electric equipment of said box.

For this purpose, the object of the invention is a traction box of the aforementioned type, wherein: the first and second fluid circuits comprise a first common conduit for circulation of a fluid, crossing the first heat exchanger; and at the output of said first heat exchanger, said first conduit is connected to a second and to a third conduits parallel for fluid circulation, said second conduit belonging to the second fluid circuit, said second conduit first crossing the second heat exchanger and then the heat exchange area with the second pieces of electrical equipment.

According to other advantageous aspects of the invention, the traction box includes one or several of the following characteristics, taken individually or according to all the technically possible combinations:

the cooling device further comprises a device for regulating a fluid flow rate in the second and/or third parallel conduits;

the regulation device and the second and third conduits are configured for a lower flow rate in the second conduit than in the third conduit;

the heat exchange area with the first pieces of electric equipment is positioned on the first common conduit for circulation of fluid;

the heat exchange area with the first pieces of electric equipment is formed with at least two heat exchange units, positioned in parallel on the first fluid circuit;

the traction box includes a first fan able to generate the first air flow, said first air flow crossing the first and second heat exchangers;

the traction box is configured so that the first and second heat exchangers are positioned in parallel in the first air flow;

the traction box includes a closed compartment in which are located the first and second pieces of electric equipment, said closed compartment being isolated from the first air flow;

the cooling device comprises a second fan able to generate a second air flow towards the second pieces of electrical equipment, the heat exchange area with the second pieces of electric equipment comprising a third heat exchanger positioned between the second fan and the second pieces of electrical equipment, the third exchanger being thereby able to cool the second air flow upstream from said second pieces of electrical equipment.

The invention further relates to a method for applying a traction box as described above, comprising the following steps: a heat transfer fluid, circulating in the first common conduit, crosses the first heat exchanger, a temperature of said heat transfer fluid then decreasing by heat exchange with the first air flow up to a first output value of said first heat exchanger; and then a first portion and a second portion of said heat transfer fluid respectively circulate in the second and the third parallel conduits, the first portion of the heat transfer fluid crossing the second heat exchanger, a temperature of said heat transfer fluid then decreasing by heat exchange with the first air flow as far as a second value, said portion of heat transfer fluid then crossing the heat exchange area with the second pieces of electric equipment; and the heat transfer fluid, or the second portion of the heat transfer fluid, at a temperature greater than the second value, crosses the heat exchange area with the first pieces of electric equipment.

BRIEF DESCRIPTION OF THE DRAWINGS

The invention further relates to a railway vehicle including at least one traction motor controlled by a traction box as described above.

The invention will be better understood upon reading the description which follows, only given as a non-limiting example and made with reference to the drawings wherein.

DETAILED DESCRIPTION OF THE INVENTION

Figure 1:
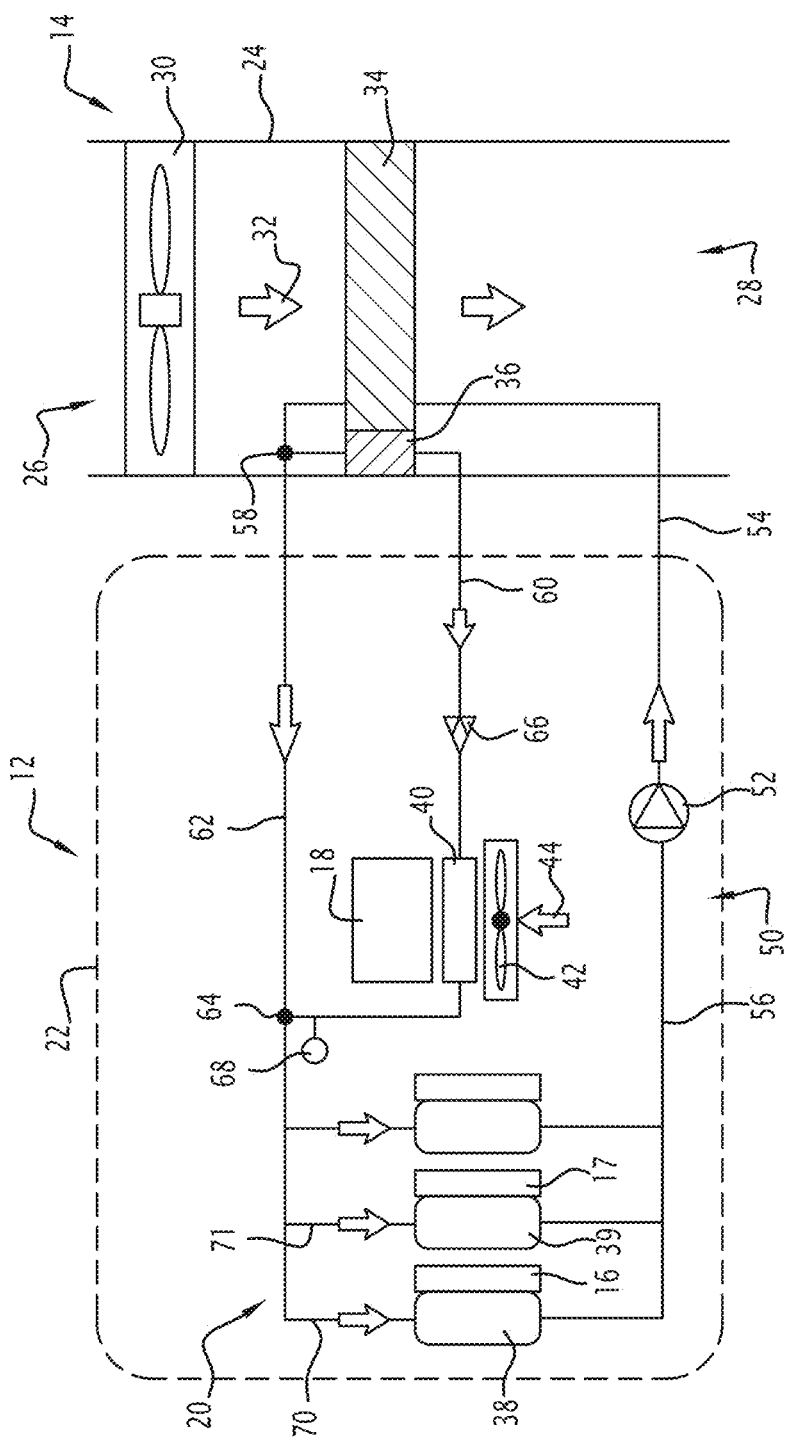
FIG. 1 is a schematic view of a traction box according to an embodiment of the invention.

FIG. 1 illustrates a schematic front view of a traction box 10 of a railway vehicle, according to an embodiment of the invention.

The box 10 includes a closed compartment 12 and a ventilation column 14. The box 10 also includes first pieces of electric equipment 16, 17 and a second piece of electric equipment 18, positioned in the closed compartment 12.

The box 10 further includes a cooling device 20, able to remove the dissipated heat, in particular in the closed compartment 12, through said first 16, 17 and second 18 pieces of electric equipment.

The cooling device 20 is positioned in the closed compartment 12 and in the ventilation column 14.

The closed compartment 12 is defined by an envelope 22, illustrated in dotted lines in FIG. 1. Preferably, the envelope 22 is air proof. Thus, the air present inside said envelope 22 is confined in the closed compartment 12.

The second piece of electric equipment 18 preferably comprises elements for which maintaining them at a suitable temperature is essential to the operation of the traction box 10. In the embodiment illustrated in FIG. 1, the second piece of electric equipment 18 is a unit for controlling traction motors of the railway vehicle.

The first pieces of electric equipment 16, 17 preferably comprise elements for which the maintaining at a suitable temperature has less priority for the operation of the traction box 10 than that of the second piece of electric equipment 18. The first pieces of electric equipment 16, 17 for example comprise circuits for treating an electric current stemming from an electric energy source external to the railway vehicle, such as a catenary.

The ventilation column 14 includes a ventilation conduit 24 which crosses the traction box 10, for example vertically. The conduit 24 includes an air intake 26 and an air outlet 28, said intake and outlet opening into the outside of the box 10.

The ventilation column 14 further includes a first fan 30, able to generate an outer air flow 32 between the intake 26 and the outlet 28 of the ventilation conduit 24.

The cooling device 20 comprises a first heat exchanger 34 and a second heat exchanger 36, positioned in the ventilation conduit 24. The first 34 and second 36 heat exchangers are of the air/fluid type, preferably air/liquid type. For example, the first 34 and the second 36 heat exchangers are radiators with fins or heat exchangers of the type plate or small bar type.

Preferably, a power of the first heat exchanger 34 is significantly greater than a power of the second heat exchanger 36. In particular, a heat exchange surface of the first heat exchanger 34 is significantly larger than a heat exchange surface of the second heat exchanger 36. For example, a ratio of the heat exchange surfaces between the second 36 and the first 34 heat exchangers is comprised between 5% and 10%.

Preferably, the first 34 and second 36 heat exchangers are positioned in parallel in the ventilation conduit 24. Thus, the outer air flow 32 comprises two portions each of which cross a single one of said first 34 and second 36 exchangers. Said first 34 and second 36 exchangers are preferentially made in a single block way, and positioned for example horizontally, side by side in the conduit 24.

The cooling device 20 further comprises third heat exchangers 38, 39, able to dissipate heat generated by the first pieces of electric equipment 16, 17. Said third heat exchangers are positioned in the closed compartment 12. As described below, each of the third heat exchangers 38, 39 is able to be crossed by a heat transfer fluid circuit.

Each of the third heat exchangers 38, 39 is for example a radiator or a cooler of the water plate type, in heat contact with one of the first pieces of electric equipment 16, 17, so as to dissipate by conduction, in the water circuit, the heat emitted by said piece of electric equipment.

The third heat exchangers 38, 39 define a heat exchange area with the first pieces of electric equipment 16, 17.

In the embodiment illustrated in FIG. 1, the box 10 includes several third heat exchangers 38, 39. In an alternative not shown, the box 10 includes a single third heat exchanger, equipping one of the first pieces of electric equipment 16, 17.

The cooling device 20 further comprises a fourth heat exchanger 40, positioned in the closed compartment 12. Said fourth heat exchanger 40 is able to be crossed by a heat transfer fluid circuit.

The fourth heat exchanger 40 is able to dissipate heat generated by the second piece of electric equipment 18. Said fourth heat exchanger 40 further gives the possibility of cooling the ambient temperature of the box 10 by transferring calories from the ambient air to the water circuit.

The fourth heat exchanger 40 defines a heat exchange area with the second piece of electric equipment 18.

In the embodiment illustrated in FIG. 1, the fourth heat exchanger 40 is of the air/fluid type, preferably air/liquid type. In an alternative not shown, the fourth heat exchanger 40 is a radiator in thermal contact with the second piece of electric equipment 18.

In the embodiment illustrated in FIG. 1, the cooling device 20 further comprises a second fan 42, positioned in the closed compartment 12. The second fan 42 is able to generate an inner air flow 44 between the fourth heat exchanger 40 and the second piece of electric equipment 18.

As an alternative not shown, the box 10 includes several fourth heat exchangers, equipping several second pieces of electric equipment as defined earlier.

The cooling device 20 further comprises a heat transfer fluid circuit 50. The circuit 50 is a closed circuit, internal to the traction box 10. The circuit 50 is able to have a heat transfer fluid circulate between the closed compartment 12 and the ventilation column 14.

The circuit 50 notably includes a circulation pump 52, able to set into motion the heat transfer fluid along a direction of circulation. The heat transfer fluid is preferably a liquid, for example water mixed with an additive such as ethylene glycol.

The circuit 50 includes a first fluid conduit 54 defined between an inlet 56 and an outlet 58. The first heat exchanger 34 is positioned on the first conduit 54. In the embodiment of FIG. 1, the circulation pump 52 is also positioned on the first conduit 54.

At the output 58, the circuit 50 is subdivided into a second 60 and a third 62 conduits positioned in parallel. Said second 60 and third 62 conduits join up together in a collecting point 64.

The second conduit 60 successively passes through the second heat exchanger 36, located in the ventilation column 14, and then by the fourth heat exchanger 40, located in the closed compartment 12, before joining up with the collecting point 64.

The circuit 50 includes a device 66 for regulating a ratio of flow rates of the heat transfer fluid between the second 60 and the third 62 conduits. Preferably, the regulation device 66 and the second 60 and third 62 conduits are configured for a lower rate in the second conduit 60 than in the third conduit 62.

In the embodiment illustrated in FIG. 1, the regulation device 66 is a device of the diaphragm type located on the second conduit 60. The diaphragm 66 imposes a fixed ratio of flow rates of heat transfer fluid between the second 60 and the third 62 conduits.

According to an alternative not shown, the regulation device 66 is a device of the three-way valve type, located at the outlet 58 of the first fluid conduit 54, giving the possibility of varying the ratio of flow rates.

Preferentially, the circuit 50 further includes one or several temperature probes 68 of the heat transfer fluid. Said probe(s) are for example located on the second conduit 60, upstream and/or downstream from the fourth heat exchanger 40. Preferably, the probe is positioned immediately downstream from the collecting point 64, for controlling the temperature at the inlet of the third heat exchangers 38, 39. In the embodiment of FIG. 1, between the collecting point 64 and the inlet 56 of the first conduit 54, the circuit 50 includes a plurality of branches 70, 71 positioned in parallel. Each of the parallel branches 70, 71 crosses one of the third heat exchangers 38, 39 associated with the first pieces of electric equipment 16, 17.

According to an alternative not shown, the parallel branches 70, 71, crossing the third heat exchangers 38, 39, form a portion of the third conduit 62 upstream from the collecting point 64.

According to another alternative not shown, the third heat exchangers 38, 39, or some of said third heat exchangers 38, 39, are positioned in series on the circuit 50.

Figure 2:
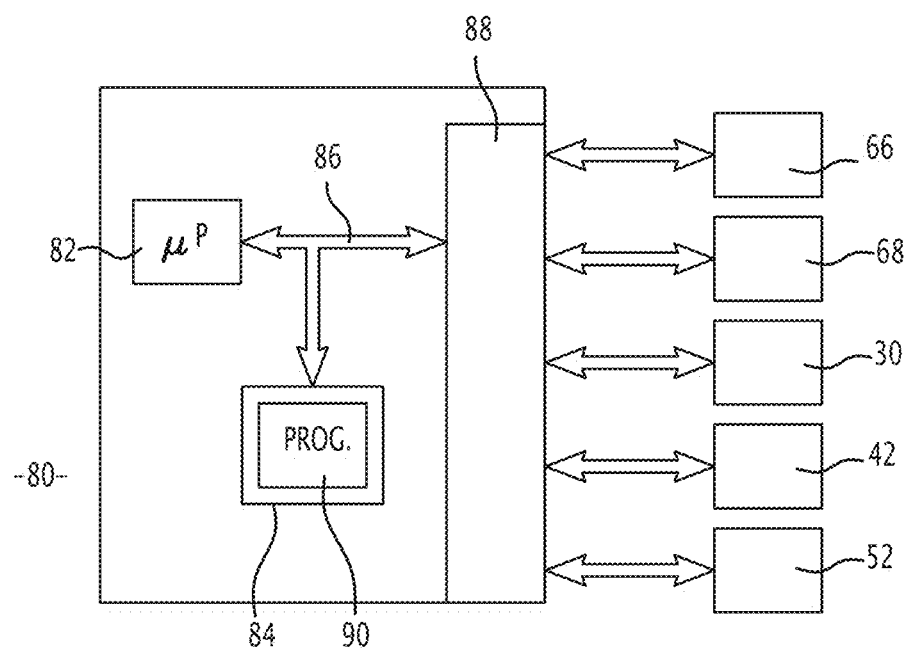
FIG. 2 is a schematic view of an electronic module for regulating the traction box of FIG. 1.

According to an embodiment of the invention, the box 10 of FIG. 1 further comprises an electronic regulation module 80, schematically illustrated in FIG. 2. According to said embodiment, the regulation device 66 is of the solenoid valve type, able to vary the flow rate between second 60 and third 62 conduits.

The electronic module 80 notably comprises a microprocessor 82, a program memory 84 and at least one communication bus 86. Through an interface 88, the module 80 is connected to said temperature probe(s) 68, at the regulation device 66 and optionally at the circulation pump 52 and/or at the first 30 and/or at the second 42 fans.

A program 90 is stored in memory in the memory 84. The program 90 is notably able to adjust the regulation device 66 for the heat transfer fluid flow rate in the second conduit 60, according to a temperature, or a difference in temperatures, measured by the probe(s) 68. Optionally, the program 90 is also able to control an operation of the circulation pump 52, and/or of adjusting a speed of rotation of the first 30 and/or of the second 42 fans.

According to another embodiment of the invention, the box 10 of FIG. 1 does not include any regulation electronics, in particular in the case when the regulation device 66 is a fixed device of the diaphragm type.

A method for operating the traction box 10 will now be described. The operation of the first 16, 17 and second 18 pieces of electric equipment leads to an increase in temperature of said pieces of electric equipment, reinforced by their confinement in the closed compartment 12.

In order to avoid overheating of said pieces of electric equipment, the outer air flow 32 generated by the first fan 30 cools the heat transfer fluid which crosses the first heat exchanger 34. It is considered that at the output 58 of said first heat exchanger 34, the heat transfer fluid is at a first temperature $T_1$. Said first temperature $T_1$ is here greater than the temperature of the outer air flow 32 at the inlet 26 of the air conduit 24.

Downstream from the outlet 58, the heat transfer fluid is distributed between the second 60 and third 62 conduits, by the regulation device 66. The fluid circulating in the second conduit 60 crosses the second heat exchanger 36. Preferably, the fluid flow rate crossing the second exchanger 36 is significantly less than the flow rate of the fluid crossing the first exchanger 34; a ratio of the fluid flow rates between the second 36 and the first 34 heat exchangers is notably comprised between 3% and 10%. For example, the flow rate in the second conduit 60 is 10 L/min and the flow rate in the third conduit 62 is 210 L/min.

In a favored way with this low flow rate, the temperature of the heat transfer fluid at the outlet of the second heat exchanger 36 attains a value $T_2$ less than $T_1$.

The heat transfer fluid circulating in the second conduit 60 then crosses the fourth heat exchanger 40 and cools the inner air flow 44 before said air flow comes into contact with the second piece of electric equipment 18. Said inner air flow 44, thereby cooled, is more efficient for cooling by convection said second piece of electric equipment 18.

The heat transfer fluid of the second conduit 60, at the lower temperature $T_2$, is therefore used for cooling the piece of electric equipment 18 considered as a priority in the box 10.

Downstream from the fourth heat exchanger 40, the heat transfer fluid of the second 60 and third 62 conduits is gathered at the collecting point 64. Said fluid then crosses the third heat exchangers 38, 39 in order to cool the first pieces of electric equipment 16, 17 considered as having less priority. At the input of said third heat exchangers 38, 39, the temperature of the heat transfer fluid is notably greater than $T_2$.

At the outlet of the third heat exchangers 38, 39, the heat transfer fluid is gathered at the inlet 56 of the first conduit 54, in order to join-up with the first heat exchanger 34.

Optionally, the inner layout of the closed compartment 12 is configured so that the inner air flow 44 circulates around the first pieces of electric equipment 16, 17 after having cooled the second piece of electric equipment 18. The inner air flow 44 thereby contributes to cooling by convection said first pieces of electric equipment 16, 17.

According to an embodiment of the invention, the operation method described above is applied by the program 90 of the electronic module 80 described above. Optionally, depending on the measured temperature(s) by said temperature probe(s) 68, the program 90 modifies in real time the adjustment of the regulation device 66, and/or the flow rate of the pump 52, and/or the speed of the first 30 and/or of the second 42 fans.

The traction box 10 as described above may be achieved by adaptations easy to apply on the existing traction boxes, comprising a closed compartment 12 and a ventilation column 14. For example, the first 34 and second 36 heat exchangers may be made in a single block way, which facilitates their installation in the ventilation conduit 24.

The invention claimed is:

1. The traction box (10) of a railway vehicle, comprising: first (16, 17) and second (18) pieces of electric equipment, and
a cooling device (20), able to remove heat dissipated by said first and second pieces of electric equipment, the cooling device comprising:

first (54, 62, 70, 71) and second (54, 60, 70, 71) fluid circuits, respectively crossing heat exchange areas with the first and second (40) pieces of electric equipment, each of the first and second fluid circuits forming a closed loop; and first (34) and second (36) heat exchangers, respectively crossed by said first (54) and second (60) fluid circuits and allowing a heat exchange between said fluid circuits and a first air flow (32), wherein:

the first and second fluid circuits comprise a first common conduit (70, 71, 54) for fluid circulation, crossing the first heat exchanger (34); and at an outlet (58) of said first heat exchanger, said first conduit is connected to second (60) and third (62) conduits parallel to the circulation of fluid, said second conduit (60) belonging to the second fluid circuit, said second conduit first crossing the second heat exchanger (36) and then the heat exchange area (40) with the second piece of electric equipment (18).

2. The traction box according to claim 1, wherein the cooling device (20) further comprises a device (66) for regulating a fluid flow rate in the second (60) and/or third (62) parallel conduits.

3. The traction box according to claim 2, wherein the regulation device (66) and the second (60) and third (62) conduits are configured for a lower flow rate in the second conduit (60) than in the third conduit (62).

4. The traction box according to claim 1, wherein the heat exchange area (38, 39) with the first pieces of electric equipment is positioned on the first common conduit for fluid circulation.

5. The traction box according to claim 1, wherein the heat exchange area with the first pieces of electric equipment is formed with at least two heat exchange units (38, 39), positioned in parallel on the first fluid circuit.

6. The traction box according to claim 1, including a first fan (30) able to generate the first air flow (32), said first air flow crossing the first (34) and second (36) heat exchangers.

7. The traction box according to claim 6, configured so that the first (34) and second (36) heat exchangers are positioned in parallel in the first air flow (32).

8. The traction box according to claim 6, including a closed compartment (12) wherein are located the first (16, 17) and second (18) pieces of electric equipment, said closed compartment being isolated from the first air flow (32).

9. The traction box according to claim 1, wherein the cooling device comprises a second fan (42) able to generate a second air flow (44) towards the second piece of electric equipment (18), the heat exchange area with the second piece of electric equipment comprising a third heat exchanger (40) positioned between the second fan and the second piece of electric equipment (18), said third exchanger thus being able to cool the second air flow upstream from said second piece of electric equipment.

10. A method for applying a traction box (10) according to claim 1, comprising the following steps:

circulating a heat transfer fluid in the first common conduit (54) crossing the first heat exchanger (34), reducing a temperature of said heat transfer fluid by heat exchange with the first air flow (32) as far as a first value ($T_1$) at the outlet (58) of said first heat exchanger; and then circulating a first portion and a second portion of said heat transfer fluid respectively in the second (60) and third (62) parallel conduits, crossing the first portion of heat transfer fluid at the second heat exchanger (36), reducing a temperature of said heat transfer fluid by heat exchange with the first air flow (32) down to a second value ($T_2$), crossing said first heat transfer fluid portion at the heat exchange area (40) with the second piece of electric equipment (18); and crossing the second portion of the heat transfer fluid, at a temperature greater than the second value ($T_2$) at the heat exchange area with the first pieces of electric equipment (16, 17).

11. A railway vehicle including at least one traction motor controlled by a traction box (10) according to claim 1.

12. The traction box according to claim 7, including a closed compartment (12) wherein are located the first (16, 17) and second (18) pieces of electric equipment, said closed compartment being isolated from the first air flow (32).

* * * * *